United States Patent
Segura et al.

(10) Patent No.: US 6,545,619 B1
(45) Date of Patent: Apr. 8, 2003

(54) SWITCHED CURRENT SOURCE

(75) Inventors: Jaume A. Segura, Palma de Mallorca (ES); Jose L. Rossello, Palma de Mallorca (ES); Ali Keshavarzi, Portland, OR (US); Siva G. Narendra, Portland, OR (US); Vivek K. De, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/040,903

(22) Filed: Dec. 28, 2001

(51) Int. Cl.⁷ ................................................. H03M 1/66
(52) U.S. Cl. ...................................... 341/136; 341/150
(58) Field of Search ............................... 341/136, 144, 341/150; 330/277; 326/36

(56) References Cited

U.S. PATENT DOCUMENTS

| | | | |
|---|---|---|---|
| 5,463,394 A | * 10/1995 | Sun | 341/136 |
| 6,037,885 A | * 3/2000 | Schmitt | 341/136 |
| 6,218,871 B1 | 4/2001 | Chiou | |
| 6,281,824 B1 | 8/2001 | Masuda | |

OTHER PUBLICATIONS

Shu–Yuan Chin, Chung–Yu Wu, "A 10–b 125 MHz CMOS Digital–to–Analog Converter (DAC) with Threshold–Voltage Compensated Current Sources," Nov. 1994, *IEEE Journal of Solid–State Circuits*, vol. 29, No. 11, pp. 1374–1380.

J. Bastos, A.M. Marques, M.S.J. Steyaert, W. Sansen, "A 12–Bit Intrinsic Accuracy High–Speed CMOS DAC," Dec. 1998, *IEEE Journal of Solid–State Circuits*, vol. 33, No. 12, pp. 1959–1969.

A.R. Bugeja, Bang–Sup Song, P.L. Rakers, S.F. Gillig, "A 14–b, 100–MS/s CMOS DAC Designed for Spectral Performance," Dec. 1999, *IEEE Journal of Solid–State Circuits*, vol. 34, No. 12, pp. 1719–1732.

Chi–Hung Lin, K. Bult, "A 10–b, 500–MSample/s CMOS DAC in 0.6 mm²," Dec. 1998, *IEEE Journal of Solid–State Circuits*, vol. 33, No. 12, pp. 1948–1958.

* cited by examiner

*Primary Examiner*—Brian Young
(74) *Attorney, Agent, or Firm*—Fish & Richardson P.C.

(57) ABSTRACT

A circuit includes a switched current source having a switching transistor coupled in series to a bias transistor. An isolation transistor is coupled in series to an output of the switched current source. The width of the switching transistor is greater than the width of the isolation transistor.

18 Claims, 3 Drawing Sheets

SWITCHED CURRENT SOURCE

BACKGROUND

Switched current sources may be used as the building blocks of complementary metallic oxide semiconductor (CMOS) circuits, such as digital-to-analog (D/A) converter circuits, that use digital input signals to control the switch portion of the current source. The switch portion may be implemented using a p-channel MOS (PMOS) transistor or an n-channel MOS (NMOS) transistor.

The switch portion may be placed in the analog portion of the circuit. The digital input signals that control the switch portion are often part of a digital portion. The digital portion and the analog portion may have separate power supplies. Occasionally, the digital power supply is exposed to a higher noise ratio than the analog portion. As a result, the noise in the digital portion may be transferred to the analog portion through the digital input signal.

DETAILED DESCRIPTION

Figure 1:
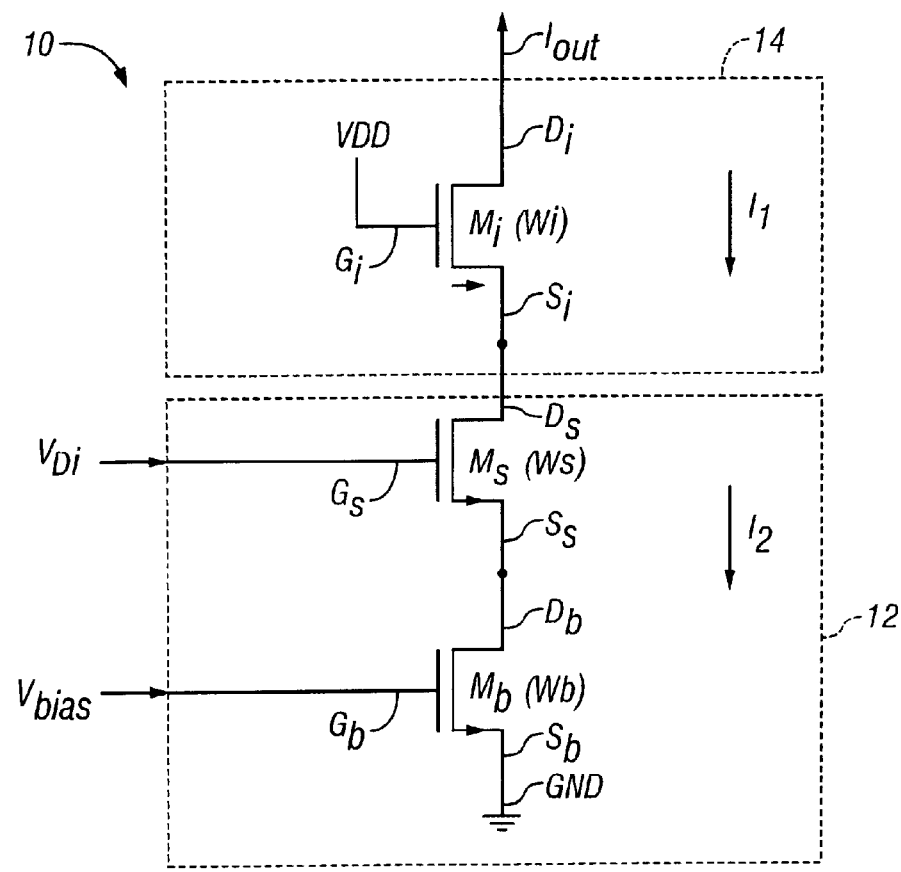
FIG. 1 is a schematic of a NMOS switched current source circuit.

As shown in FIG. 1, an NMOS switched current source circuit 10 includes a switched current source portion 12 coupled to an isolation circuit portion 14, the latter portion 14 includes an isolation transistor Mi through which an output current (Iout) flows. The switched current source portion 12 includes a switching transistor Ms coupled to a bias transistor Mb. The output current (Iout) varies in response to a digital input signal (Vdi) applied Lo a gate terminal Gs of the transistor Ms. The noise sensitivity (NS) of the switched current source circuit 10 is a parameter that can be defined as the sensitivity of the output current (Iout) to noise that may accompany the digital input signal (Vdi). The noise sensitivity (NS) can be improved by selecting a transistor ratio (N) defined as N=Ws/Wi, where (Ws) is a width of the transistor Ms and (Wi) is a width of the transistor Mi, such that the ratio is at least equal to one.

Figure 2:
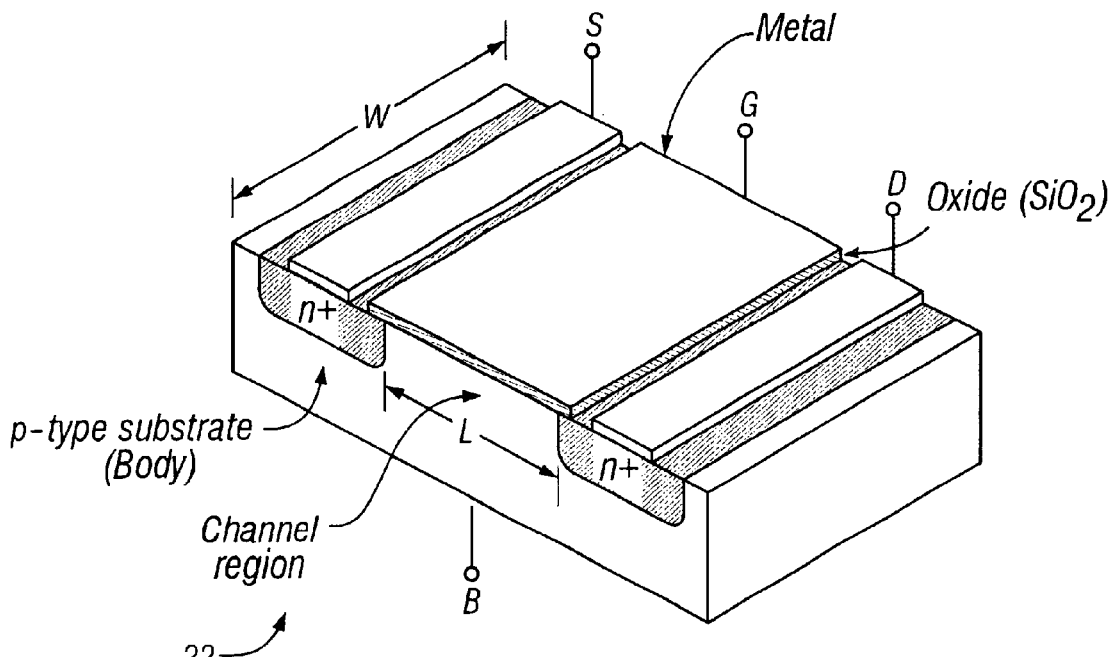
FIG. 2 is a diagram illustrating the physical dimensions of a transistor.

FIG. 2 illustrates the physical dimensions of an NMOS transistor 22 that can be used as any of the transistors Mi, Ms, Mb in the switched current source circuit 10. The transistor 22 has a gate terminal G, a source terminal S, and a drain terminal D. The transistor 22 has a width (W) corresponding to the width of a body of the transistor and a length (L) corresponding to the length of a channel region of the transistor. The gate terminal G is composed of a metal and is separated from the channel region by a layer of oxide.

The width (W) can range from 0.5 to 20 microns ($\mu$m) depending on the transistor technology and the output drive current capacity. For high performance applications, a "fingered" technique can be used in which a transistor with a total width (W) can be divided into smaller widths, such as 5 $\mu$m. In general, as the width (W) is increased, there is an increase in the current the transistor can handle and a corresponding increase in power consumption. The transistor 22 can handle currents up to about 0.5 milliamps per micron (mA/$\mu$m) for PMOS technology and 1 mA/$\mu$m for NMOS technology. For example, a PMOS transistor with a width (W) of 10 $\mu$m can conduct about 10 mA of current.

Referring back to FIG. 1, the circuit 10, the bias transistor Mb has a gate terminal Gb coupled to an input signal (Vbias), a drain terminal Db coupled to the source terminal Ss of the switching transistor Ms, and a source terminal Sb connected to ground Gnd. The value of the output current (Iout) can be adjusted by setting the input signal (Vbias) to a value ranging from 0 volts to VDD volts to produce a maximum value of Iout. A system voltage VDD, such as 3 volts, provides power to the switched current source circuit 10 and is a function of the transistor technology.

The switching transistor Ms has a gate terminal Gs coupled to the input signal (Vdi) and a drain terminal Ds coupled to a source terminal Si of the isolation transistor Mi. The transistor Ms is configured to operate as a switch and is placed in an ON state when the input signal (Vdi) is at a HIGH voltage level such as VDD. Similarly, the transistor Ms is placed in an OFF state when the digital input signal (Vdi) is at a LOW voltage level such as 0 volts. When the transistor Ms is in the ON state, the output current (Iout) is allowed to flow through the transistor Mi, whereas when the transistor Ms is in the OFF state, the output current (Iout) is prevented from flowing through the transistor Mi.

The isolation transistor Mi has a gate terminal Gi coupled to the supply voltage VDD that causes the transistor to remain in an ON state. The output current (Iout) flows through the drain terminal Di of the transistor Mi. By coupling the isolation circuit portion 14 to the switched current source portion 12, the transistor ratio (N) can be adjusted to allow the noise sensitivity (NS) of the switched current source circuit 10 to be reduced.

In operation, when the digital input signal (Vdi) is at a LOW value, the switching transistor Ms is placed in an OFF state, preventing the flow of the output current (Iout). On the other hand, when the digital input signal (Vdi) is at a HIGH value, the transistor Ms is placed in an ON state, allowing the output current Iout to flow through the isolation transistor Mi. The current I1 through the isolation transistor Mi can be represented by:

$$I_1 = I_{max1}(VDD-Vs-Vt)(\alpha)/VDD-Vt) \qquad (1)$$

where $I_{max1}$ is the maximum current that the transistor Mi can provide, Vsi is the source voltage of the transitor and Vt is the threshold voltage of that transistor. If the transistor Mi has a small channel, the parameter $\alpha$ can be assumed to be about 1. If the transistor ratio (N) is large, then the voltage Vb is small, and the transistor Ms operates in the linear region. Quadratic terms in the linear expression of the alpha power law current for sub-micron devices can be ignored.

The alpha parameter for a short channel transistor is about 1.1 to 1.2 in current technologies. The current $I_2$ through the switching transistor Ms is given by:

$$I_2=2*N*I_{max1}(Vss/Vdo)((VDD-Vss-Vt)/(VDD-Vt)), \quad (2)$$

where Vdo is the drain saturation voltage of the isolation transistor Mi and Vss is the source voltage of the transistor. Assuming that Vss is small and Equating the expressions for $I_1$ and $I_2$, the output current Iout is given by:

$$Iout=I_{max1}(VDD+1/(-2*N*Vdi-Vdo+2*N*Vt)Vdo(VDD-Vt)-Vt)/(VDD-Vt). \quad (3)$$

As discussed above, the noise sensitivity (NS) of the circuit 10 can be defined as the sensitivity of the output current (Iout) to noise that may accompany the digital input signal (Vdi). The noise sensitivity (NS) can be represented by calculating the derivative of the output current (Iout) with respect to the input voltage (Vdi) when the digital input voltage (Vdi) is at a high value of VDD:

$$NS=dIout/dVdi(Vdi=VDD)=2*I_{max}/(2*N*VDD-Vdo-2*N*Vt)^2 Vdo*N. \quad (4)$$

That expression illustrates that the sensitivity is approximately inversely proportional to the term $1/N(VDD-Vt)^2$ such that a larger transistor ratio (N) produces a smaller sensitivity (NS). As a result, the smaller the sensitivity (NS), the more immune the switched current source circuit 10 is to noise that may be coupled through the digital input signal (Vdi).

Figure 3:
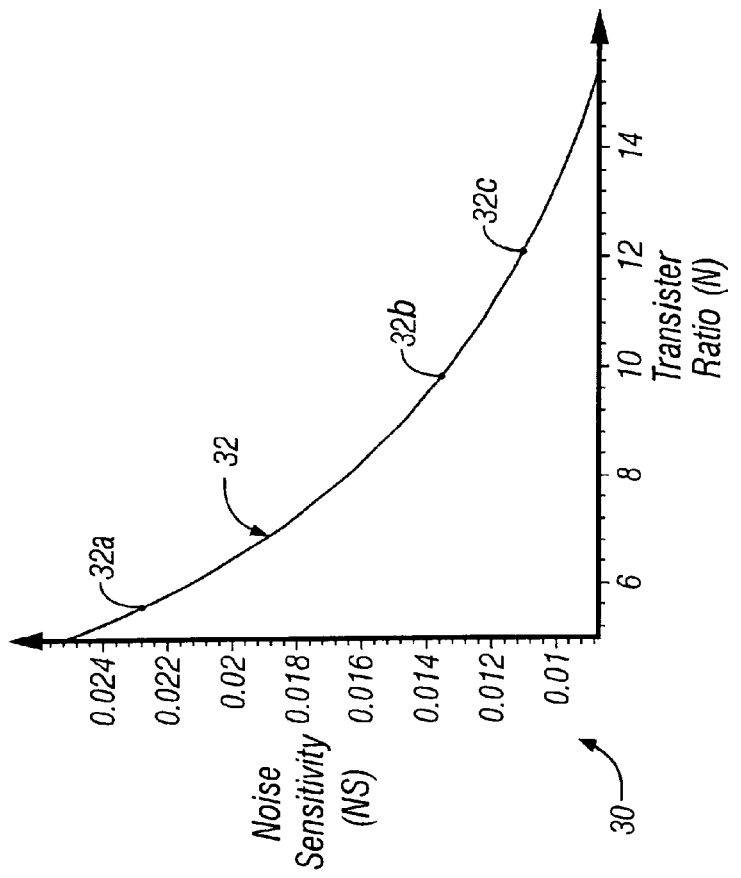
FIG. 3 is graph of the noise sensitivity of a switched current source circuit.

FIG. 3 illustrates a graph 30 showing a plot 32 of the noise sensitivity (NS), as represented by equation (4), as a function of the transistor ratio (N). As can be seen, the plot 32 decreases monotonically from a sensitivity (NS) of approximately 0.024 to 0.010 as the value of the transistor ratio (N) increases from approximately 5 to 14.

Data point 32a represents a transistor ratio (N) of 6 corresponding to a noise sensitivity (NS) of approximately 0.023. Increasing the transistor ratio (N) to 12, as shown by data point 32c, reduces the noise sensitivity to approximately 0.011. However, as the transistor ratio (N) is increased, the physical size of the transistor also is increased, requiring a larger real estate area on a chip. Data point 32b represents a preferred transistor ratio (N) of 10.

Figure 4:
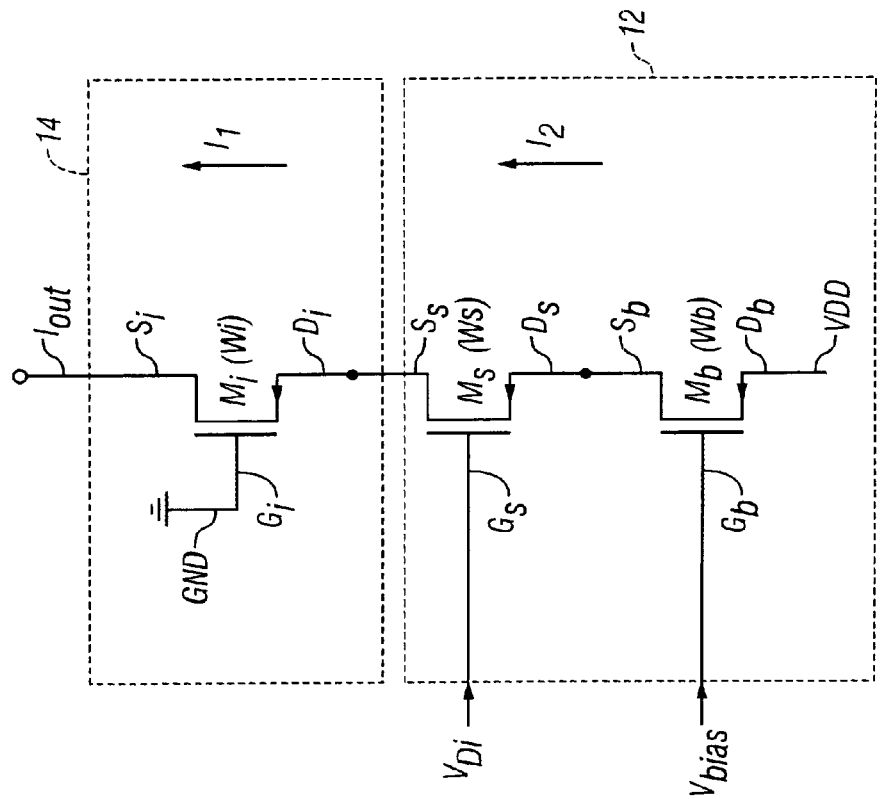
FIG. 4 is a schematic of a PMOS switched current source circuit.

In the foregoing embodiment, NMOS transistors are used to implement the switched current source circuit 10. However, PMOS transistors can be used in the place of the NMOS transistors to implement the switched current circuit as shown in FIG. 4. In this case, the gate terminal Gi of the isolation transistor Mi is tied to Gnd instead of VDD and the drain terminal Db of the base transistor Mb is tied to VDD instead of Gnd. In addition, the direction of the currents $I_1$ and $I_2$ in the PMOS embodiment is opposite in direction to direction of the currents $I_1$ and $I_2$ in the NMOS embodiment.

Figure 5:
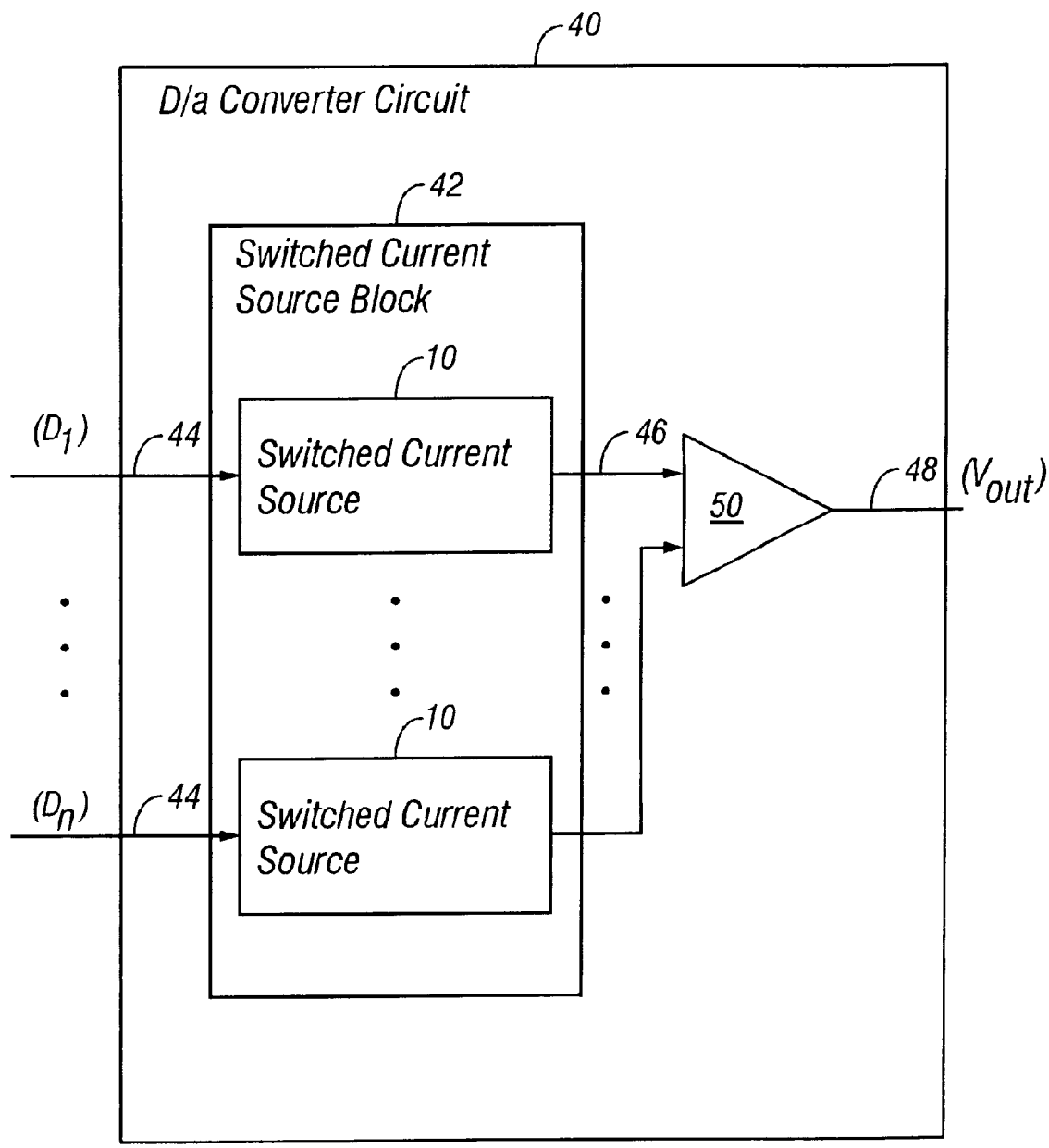
FIG. 5 is a block diagram of D/A converter using a switched current source circuit.

FIG. 5 shows a block diagram of a digital-to-analog (D/A) converter circuit 40 that includes one or more switched current source circuits 10 as part of a switched current source block 42. Digital input signals D1 to Dn are coupled to the digital inputs terminals 44 of the switched current source circuits 10. The output of each switched current source circuit 10 is coupled to a respective input terminal 46 of an amplifier circuit 50 that produces a corresponding analog output signal (Vout) on terminal 48. By using the switched current source circuits 10, the noise sensitivity (NS) of the D/A converter circuit 40 can be reduced. As a result, the analog output signal (Vout) is less sensitive to noise that may accompany the digital input signals D1 to Dn.

The presence of the isolation transistor Mi allows the transistor ratio (N) to be increased, resulting in a reduction in the noise sensitivity (NS). The transistor ratio (N) can be increased by making the size of the width (Ws) of the switching transistor Ms to a size larger than the width (Wi) of the isolation transistor Mi. As a result, the invention provides a low cost solution to the reduction of the noise sensitivity of switched current source circuits.

The techniques may be applicable to CMOS circuits that require a switched current source such as D/A converter circuits and analog-to-digital (A/D) converter circuits. The circuit 10 also can be used as a delay element in delayed locked loop (DLL), or other circuits.

Other implementations are within the scope of the following claims.

What is claimed is:

1. A circuit comprising:

a switched current source having a switching transistor coupled in series to a bias transistor; and an isolation transistor coupled in series to an output of the switched current source, wherein a width of the switching transistor is greater than a width of the isolation transistor.

2. The circuit of claim 1 wherein the width of the isolation transistor is in the range of 0.5 to 20 μm.

3. The circuit of claim 1 wherein the width of the switching transistor is in the range of 0.5 to 20 μm.

4. The circuit of claim 1 wherein a ratio of a width of the switching transistor to a width of the isolation transistor is in the range of 1 to 14.

5. The circuit of claim 1 wherein the switching transistor, the bias transistor, and the isolation transistor is an NMOS transistor.

6. The circuit of claim 1 wherein the switching transistor, the bias transistor, and the isolation transistor is a PMOS transistor.

7. A switched current source circuit comprising:

a switched current source having a switching transistor whose state is controlled by an digital input signal, the switching transistor coupled in series to a bias transistor; and an isolation transistor coupled in series to an output of the switched current source, wherein a ratio of a width of the switching transistor to a width of the isolation transistor is greater than one.

8. The circuit of claim 7 wherein the width of the isolation transistor is in the range of 0.5 to 20 μm.

9. The circuit of claim 7 wherein the width of the switching transistor is in the range of 0.5 to 20 μm.

10. The circuit of claim 7 wherein the ratio of a width of the switching transistor to a width of the isolation transistor is in the range of 1 to 14.

11. The circuit of claim 7 wherein the switching transistor, the bias transistor, and the isolation transistor is an NMOS transistor.

12. The circuit of claim 7 wherein the switching transistor, the bias transistor, and the isolation transistor is a PMOS transistor.

13. A digital-to-analog converter comprising:
input terminals to receive digital signals; and
switched current source circuits, each circuit comprising:
a switched current source having a switching transistor with a gate coupled to receive a digital signal from a respective one of the input terminals, the switching transistor coupled in series to a bias transistor, and
an isolation transistor coupled to an output of the switched current source,
wherein a width of the switching transistor is greater than a width of the isolation transistor; and
an output buffer circuit coupled to receive an output from each isolation transistor to provide an analog output signal based on the digital signals.

14. The converter of claim 13 wherein the width of the isolation transistor is in the range of 0.5 to 20 $\mu$m.

15. The converter of claim 13 wherein the width of the switching transistor is in the range of 0.5 to 20 $\mu$m.

16. The converter of claim 13 wherein a ratio of a width of the switching transistor to a width of the isolation transistor is in the range of 1 to 14.

17. The converter of claim 13 wherein the switching transistor, the bias transistor, and the isolation transistor is an NMOS transistor.

18. The converter of claim 13 wherein the switching transistor, the bias transistor, and the isolation transistor is a PMOS transistors.

* * * * *